United States Patent
Amano

(10) Patent No.: US 7,057,458 B2
(45) Date of Patent: Jun. 6, 2006

(54) BALANCED POWER AMPLIFIER AND HIGH-FREQUENCY COMMUNICATION APPARATUS

(75) Inventor: Yoshihisa Amano, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 65 days.

(21) Appl. No.: 10/936,650

(22) Filed: Sep. 9, 2004

(65) Prior Publication Data

US 2005/0052232 A1    Mar. 10, 2005

(30) Foreign Application Priority Data

Sep. 10, 2003    (JP) ............................ P2003-317957

(51) Int. Cl.
*H03F 3/45*    (2006.01)

(52) U.S. Cl. .................. 330/252; 330/124 R; 330/295; 330/301

(58) Field of Classification Search ................ 330/275, 330/301, 116, 117, 124 R, 295, 252
See application file for complete search history.

(56) References Cited

U.S. PATENT DOCUMENTS 6,201,445 B1 * 3/2001 Morimoto et al. .......... 330/295
6,545,542 B1 * 4/2003 Matsuyoshi et al. ........ 330/301

FOREIGN PATENT DOCUMENTS

JP    2001-094360 A    4/2001
JP    2001-267857 A    9/2001

* cited by examiner

*Primary Examiner*—Khanh V. Nguyen
(74) *Attorney, Agent, or Firm*—Birch, Stewart, Kolasch & Birch, LLP

(57) ABSTRACT

A balanced power amplifier includes grounded-emitter first and second bipolar transistors that are disposed in parallel, first and second variable impedance elements with each one end being electrically connected to each base of the first and second bipolar transistors, a regulator circuit disposed between the other end of the first variable impedance element and the other end of the second variable impedance element, a first resistance for electrically connecting the line between the first variable impedance element and the regulator circuit and a voltage source, and a second resistance for electrically connecting the line between the second variable impedance element and the regulator circuit and the voltage source. The balanced power amplifier is small in the number of component parts and in size.

11 Claims, 9 Drawing Sheets

US 7,057,458 B2

BALANCED POWER AMPLIFIER AND HIGH-FREQUENCY COMMUNICATION APPARATUS

This Nonprovisional application claims priority under 35 U.S.C. §119(a) on Patent Application No. 2003-317957 filed in Japan on Sep. 10, 2003, the entire contents of which are hereby incorporated by reference.

BACKGROUND OF THE INVENTION

The present invention relates to a balanced (differential) power amplifier and a high-frequency communication apparatus having the power amplifier.

One of the major issues in portable wireless communication terminals such as cell phones and PDAs (Personal Digital Assistances) with wireless LAN function is to develop power amplifiers with improved efficiency and reduced power consumption.

For example, as stated in detail in JP 2001-94360 A, the power amplifiers are circuit components in which lower power of several milli-Watts order produced in a signal processing section in a portable terminal is amplified at once up to high power of almost Watt order and transmitted to a transmission antenna. Thus, the power amplifiers process signals of high power, and therefore their power consumption is several orders of magnitude larger than that of most of other electric components, which largely affects battery consumption.

Approaches to develop power amplifiers with improved efficiency and reduced power consumption include one using a distortion compensation circuit stated in the aforementioned JP 2001-94360 A. In this approach, the distortion compensation circuit is used to suppress the distortion component of an output signal from a power amplifier so that the power amplifier operates in the vicinity of the region of higher nonlinearity (the maximum saturated power region or the class-C bias region) to improve efficiency and reduce power consumption.

FIG. 12 is a circuit diagram showing a power amplifier having the distortion compensation circuit disclosed in JP 2001-94360 A. As shown in FIG. 12, a grounded-emitter bipolar transistor 1004 amplifies high-frequency electric signals inputted from an input terminal 1001 and outputs them to an output terminal 1002. Moreover, direct-current bias applied to the base of the transistor 1004 is fed from a voltage source 1003 via a variable impedance element 1005. Moreover, an impedance regulator circuit 1008 is connected to a midpoint between the voltage source 1003 and the variable impedance component 1005.

The impedance regulator circuit 1008 is structured such that a series circuit composed of a resistance 1006 and a capacitance component 1007 is short-circuited to the ground.

Generally, most power amplifiers are designed to have a single-end structure, though some power amplifiers are designed to have a balanced structure for specific purposes. For example, JP 2001-267857 A discloses an example in which a power amplifier of balanced structure in high-frequency bands is implemented for the purpose of high-efficiency push-pull amplification.

FIG. 13 is a schematic view showing the configuration of a balanced amplifier shown in the aforementioned JP 2001-267857 A. In this balanced amplifier, a high-frequency electric signal inputted from an input terminal 1401 is divided by a reversed-phase power divider 1405 into signals whose phases are different by 180 degrees from each other. These reversed-phase signals are amplified by two unit amplification circuits 1403, 1404, and then combined efficiently by a reversed-phase power combiner 1406 before being outputted from an output terminal 1402.

FIG. 14 is a schematic block diagram showing a transmission system in a conventional high-frequency communication apparatus, more precisely, a schematic block diagram showing a transmission system of a multi-mode and multi-band wireless communication apparatus supporting a plurality of different communication systems, which is demanded from the fourth-generation cell phones (System Beyond IMT-2000) and the like.

As shown in FIG. 14, the high-frequency communication apparatus is composed of four communication systems, a 800 MHz-band cell phone, a 1.9 GHz-band cell phone, a 2.4 GHz-band wireless LAN and a 5.2 GHz-band wireless LAN.

In the high-frequency communication apparatus, inside a casing 1321, a transmission signal in the 800 MHz-band produced by a signal source 1313 is amplified by an amplifier 1305 and radiated from an antenna 1301, while a transmission signal in the 1.9 GHz-band produced by a signal source 1314 is amplified by an amplifier 1306 and radiated from an antenna 1302. Further, a transmission signal in the 2.4 GHz-band produced by a signal source 1315 is amplified by an amplifier 1307 and radiated from an antenna 1303, while a transmission signal in the 5.2 GHz-band produced by a signal source 1316 is amplified by an amplifier 1308 and radiated from an antenna 1304.

These four signal sources 1313 to 1316 are generally implemented by RFIC (Radio Frequency Integrated Circuit) technology and their output lines 1317 to 1320 are generally differential lines, whereas four amplifier circuits 1305 to 1308 are generally of single-end structure. Because of this reason, four baluns 1309 to 1312 are inserted for connecting these signal sources and amplifier circuits.

However, the power amplifier with the distortion compensation circuit shown in FIG. 12 is produced on the assumption that the amplifier circuit is of single-end structure. Consequently, in the case where, for example, two unit amplifier circuits are disposed in parallel to form a balanced amplifier circuit, applying the distortion compensation circuit shown in FIG. 12 to the balanced amplifier circuits doubles the number of component parts of the distortion compensation circuit section, thereby posing a problem that the amplifier circuit is upsized.

Moreover, the balanced amplifier circuit receives the input of two types of high-frequency electric signal, an odd mode (reversed-phase component) signal and an even mode (common-mode component) signal. Therefore, in installing the distortion compensation circuit in the balanced amplifier circuit, the circuit operation of the distortion compensation circuit is not uniquely determined and should be of various types depending on uses, which causes a problem that respective uses requires solutions.

For example, in the balanced amplifier shown in FIG. 13, on a line shown by a reference symbol M in FIG. 13, an even mode (common-phase component) that is an unnecessary parasitic component is present in addition to an odd mode (reversed-phase component) that is an originally intended electric signal. Consequently, in installing the distortion compensation circuit in the unit amplifiers 1403, 1404, the distortion compensation circuit should be operated normally for the odd mode, whereas the operation of the distortion compensation circuit should be changed for the even mode depending on uses. More specifically, for the even mode, the operation needs to be changed corresponding to the cases where the distortion compensation circuit should be operated, where the distortion compensation circuit should not be operated, and where the circuit should be operated not as a distortion compensation circuit but as an attenuator. For these three cases, different circuit operations are necessary.

SUMMARY OF THE INVENTION

Accordingly, an object of the present invention is to provide a balanced power amplifier having a distortion compensation circuit small in the number of component parts and in size, in which distortion compensation for an odd mode is performed while distortion compensation for an even mode is performed or not performed, or attenuation is carried out for the even mode, as well as to provide a high-frequency communication apparatus having the power amplifier.

In order to solve the aforementioned problems, a balanced power amplifier in the present invention comprises:

a voltage source;

a first power amplifier element including at least a grounded-emitter first bipolar transistor;

a second power amplifier element including at least a grounded-emitter second bipolar transistor;

a first variable impedance element, one end of which is electrically connected to a base side of the first bipolar transistor;

a second variable impedance element, one end of which is electrically connected to a base side of the second bipolar transistor;

a two-terminal regulator circuit connected to between the first variable impedance element and the second variable impedance element;

a first resistance connected to between a first node disposed between the first variable impedance element and the regulator circuit and the voltage source;

a second resistance connected to between a second node disposed between the second variable impedance element and the regulator circuit and the voltage source;

a first input terminal connected to a third node disposed between a base side of the first bipolar transistor in the first power amplifier element and the first variable impedance element; and a second input terminal connected to a fourth node disposed between a base side of the second bipolar transistor in the second power amplifier element and the second variable impedance element, wherein the first and second power amplifier elements are driven in parallel and in opposite phase.

It is to be noted that the respective first and second power amplifier elements may be composed of only the first and second bipolar transistors respectively, or may be composed of multistage bipolar transistors, or may be composed of resistances and the like being combined.

Moreover, the variable impedance element refers to an impedance whose value varies depending on potential difference between the opposite ends thereof.

According to the balanced power amplifier in the present invention, the first and second variable impedance elements and the regulator circuit can compensate the distortion for an odd mode. Therefore, the number of component parts of a distortion compensation circuit may be reduced lower than that in the case where a distortion compensation circuit section of the balanced amplifier circuit is formed from two distortion compensation circuit sections disposed in parallel in an amplifier circuit of single-end structure. This makes it possible to downsize the power amplifier and reduce manufacturing costs of the power amplifier.

Further, according to the balanced power amplifier in the present invention, proper regulation of the regulator circuit according to uses makes it possible to easily compensate or not to compensate the distortion in a even mode or to attenuate the even mode. Therefore, the power amplifier becomes excellent in general versatility.

In one embodiment of the balanced power amplifier, the regulator circuit is a single capacitance component whose opposite ends are connected to the first node and the second node.

According to the above embodiment, the regulator circuit is composed of a single capacitance component whose opposite ends are connected to the first node and the second node. Consequently, for the odd mode (reversed-phase component), a plane running the center between the electrodes of the capacitance component and being in parallel with the electrodes is a virtual ground, which allows compensation of the distortion in the odd mode (reversed-phase component). For the even mode (common-phase component), the potential difference between the opposite ends of the capacitance component is 0, so that the capacitance component will not function, thereby making it possible to prevent execution of the distortion compensation.

In one embodiment of the balanced power amplifier, the regulator circuit is composed of a first capacitance component connected to between the first node and a ground, and a second capacitance component connected between the second node and a ground.

According to the above embodiment, the regulator circuit is composed of a first capacitance component connected between the first node and a ground and a second capacitance component connected between the second node and a ground, which brings about the structure in which the potential difference is generated between the opposite ends of two capacitance components in either the odd mode (reversed-phase component) or the parasitic even mode (common-phase component). Therefore, the distortion compensation function operates without discrimination between the odd mode and the even mode.

In one embodiment of the balanced power amplifier, the regulator circuit is a T-shaped circuit composed of two capacitance components disposed in series between the first node and the second node, and a resistance connected to between a node disposed between these two capacitance components and a ground.

According to the above embodiment, the regulator circuit is a T-shaped circuit composed of two capacitance components disposed in series between the first node and the second node, and a resistance connected to between a node disposed between these two capacitance components and a ground. Consequently, for the odd mode (reversed-phase component), the node between two capacitance components plays as a virtual ground, and with the virtual ground as a reference, two capacitance components on the opposite ends of the virtual ground generate potential difference. Therefore, the distortion compensation function can function for the odd mode. For the parasitic even mode (common-phase component), the potential of the node between aforementioned two capacitance components will not become 0, so that the resistance functions. Therefore, setting the value of the resistance at a value which tends to absorb and attenuate high-frequency signals (e.g., approx. 1 to 50Ω) allows the resistance to function as an attenuator, thereby allowing attenuation for the even mode (common-phase component).

In one embodiment of the balanced power amplifier, the first variable impedance element is composed of a first diode element having an anode connected to the first node and a cathode connected to the third node, while the second variable impedance element is composed of a second diode element having an anode connected to the second node and a cathode connected to the fourth node.

According to the above embodiment, the first variable impedance element is composed of a first diode element having the aforementioned directional property, while the second variable impedance element is composed of a second diode element having the aforementioned directional property. Consequently, the voltage dependence of the opposite ends of the first and second diode elements that are variable impedance elements may be identical to the voltage dependence of the opposite ends of each impedance in a diode portion between the base and the emitter in the first and second bipolar transistors. Therefore, regardless of the size of inputted voltages, phase distortion may be compensated while amplitude distortion of outputted voltages is compensated to prevent a gain from decreasing.

In one embodiment of the balanced power amplifier, the first variable impedance element includes a third bipolar transistor which is structured so as to form PN junction between the first resistance component and a base of the first bipolar transistor, while the second variable impedance element includes a fourth bipolar transistor which is structured so as to form PN junction between the second resistance component and a base of the second bipolar transistor.

According to the above embodiment, the first variable impedance element includes a third bipolar transistor which is structured so as to form PN junction between the first resistance component and a base of the first bipolar transistor, while the second variable impedance element includes a fourth bipolar transistor which is structured so as to form PN junction between the second resistance component and a base of the second bipolar transistor. Consequently, the voltage dependence of the opposite ends of each impedance in a diode portion between the base and the emitter in the first and second bipolar transistors may be identical to the voltage dependence of the opposite ends of the impedance in the PN junction portion of the third and fourth bipolar transistors. Therefore, regardless of the size of inputted voltages, phase distortion may be compensated while amplitude distortion of outputted voltages is compensated to prevent a gain from decreasing.

In one embodiment of the balanced power amplifier, the first variable impedance element is composed of a third bipolar transistor having a collector and a base connected to the first node and an emitter connected to the third node, while the second variable impedance element is composed of a fourth bipolar transistor having a collector and a base connected to the second node and an emitter connected to the fourth node.

According to the above embodiment, the first variable impedance element is composed of a third bipolar transistor having the aforementioned directional property, while the second variable impedance element is composed of a fourth bipolar transistor having the aforementioned directional property. Consequently, respective emitter currents of the third and fourth bipolar transistors may be set to be the sum of respective base currents and respective collector currents, and may also be proportional to the respective base currents. Therefore, the respective emitter currents of the third and fourth bipolar transistors obtain current-voltage characteristics like diodes with respect to the inputted voltages, so that regardless of the size of the inputted voltages, amplitude distortion of outputted voltages may be compensated to prevent a gain from decreasing, and also phase distortion may be compensated.

In one embodiment of the balanced power amplifier, the first variable impedance element is composed of a third bipolar transistor having an emitter connected to the first node, a base connected to a node disposed between the first resistance and the voltage source side, and a collector connected to the third node, while the second variable impedance element is composed of a fourth bipolar transistor having an emitter connected to the second node, a base connected to a node disposed between the second resistance and the voltage source side, and a collector connected to the fourth node.

According to the above embodiment, the first variable impedance element is composed of a third bipolar transistor having the aforementioned directional property, while the second variable impedance element is composed of a fourth bipolar transistor having the aforementioned directional property. Consequently, changing the first and second resistances makes it possible to regulate collector currents and emitter currents of the respective transistors. Therefore, even after the third and fourth bipolar transistors to be used are selected, regulating the values of the first and second resistances allows adjustment of the operating characteristics of the third and fourth bipolar transistors, which makes it possible to increase regulation freedom in the distortion compensation and to provide the power amplifier with a high-efficiency power amplification factor.

In one embodiment of the balanced power amplifier, the first variable impedance element is composed of a third bipolar transistor having a base connected to the first node, a collector connected to a node disposed between the first resistance and the voltage source side, and an emitter connected to the third node, while the second variable impedance element is composed of a fourth bipolar transistor having a base connected to the second node, a collector connected to a node disposed between the second resistance and the voltage source side, and an emitter connected to the fourth node.

The transistor performs transistor operation even if the connecting relation of the emitter and the collector is reversed, the collector current is almost proportional to the base current, and the collector current has current-voltage characteristics like diodes with respect to the inputted voltages.

According to the above embodiment, the first variable impedance element is composed of a third bipolar transistor having the aforementioned directional property, while the second variable impedance element is composed of a fourth bipolar transistor having the aforementioned directional property. Therefore, even after the third and fourth bipolar transistors to be used are selected, regulating the values of the first and second resistances makes it possible to increase regulation freedom in the distortion compensation and to provide the power amplifier with a high-efficiency power amplification factor.

In one embodiment of the balanced power amplifier, the first and second bipolar transistors and the first and second variable impedance elements are integrally formed on one semiconductor substrate.

According to the above embodiment, the first and second bipolar transistors and the first and second variable impedance elements are integrally formed on one semiconductor substrate, which makes it possible to downsize the power amplifier and reduce manufacturing costs of the power amplifier.

A high-frequency communication apparatus in the present invention comprises:

a high-frequency integrated circuit serving as a transmission signal source;

the balanced power amplifier as defined in claim 1 for receiving differential output signals outputted from the high-frequency integrated circuit and amplifying the differential output signals;

a reversed-phase power combiner for performing reversed-phase power combination of the signals from the balanced power amplifier; and an antenna section for radiating the signals from the reversed-phase power combiner outward.

According to the high-frequency communication apparatus of the present invention, the balanced power amplifier of the present invention is provided, which allows the high-frequency communication apparatus to reduce its size, weight, and cost.

According to the high-frequency communication apparatus of the present invention, the distortion compensation circuit in the balanced power amplifier can be downsized, and the downsized distortion compensation circuit makes it possible to achieve increased efficiency and reduced power consumption. The distortion compensation circuit included in the balanced power amplifier in the present invention performs normal distortion compensation operation for an original odd mode (reversed-phase component), whereas for an even mode (common-phase component) that is a parasitic component, it is possible to select the operation of the circuit from three options (performing distortion compensation, not performing distortion compensation, functioning not as a distortion compensation circuit but as an attenuator) depending on uses.

Further, according to the high-frequency communication apparatus of the present invention, it becomes possible to reduce the number of component parts and achieve reduction in size, weight and cost.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
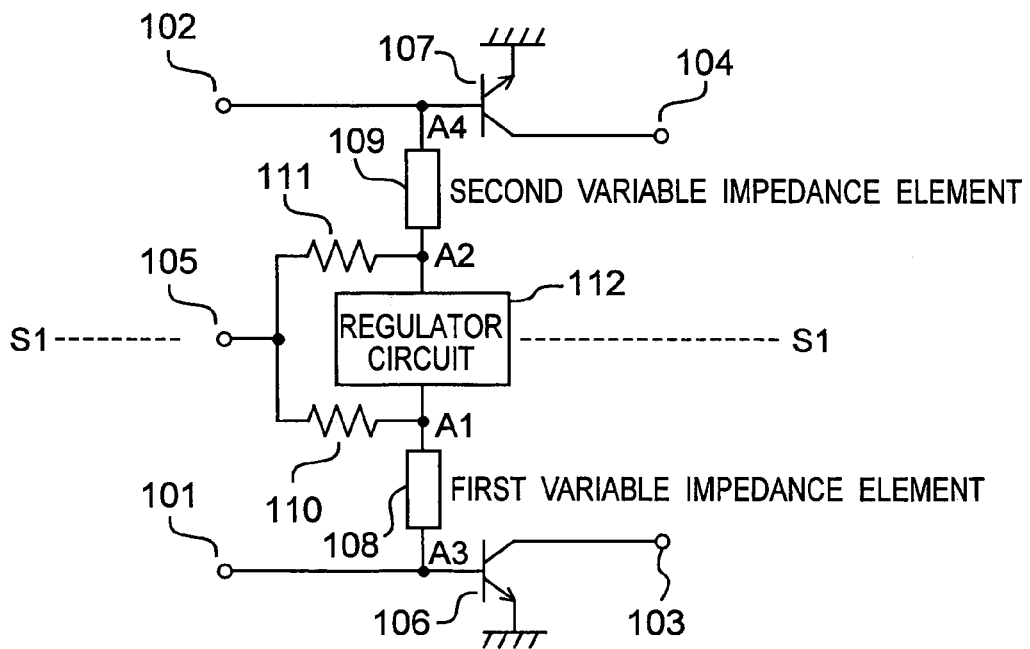
FIG. 1 is a view showing the basic configuration of a balanced power amplifier in the present invention.

FIG. 1 is a view showing the basic configuration of a balanced power amplifier in the present invention.

The basic configuration of the balanced power amplifier in the present invention is composed of, as shown in FIG. 1, a grounded-emitter first bipolar transistor 106, a grounded-emitter second bipolar transistor 107, a first variable impedance element 108 whose one end is electrically connected to the base side of the first bipolar transistor 106, a second variable impedance element 109 whose one end is electrically connected to the base side of the second bipolar transistor 107, and a two-terminal regulator circuit 112 whose one end is electrically connected to the other end of the first variable impedance element 108, and whose other end is electrically connected to the other end of the second variable impedance element 109. Moreover, the basic configuration of the balanced power amplifier is composed of, as shown in FIG. 1, a first resistance 110 connected to between a first node A1 disposed between the first variable impedance element 108 and the regulator circuit 112 and a voltage source 105, a second resistance 111 connected to between a second node A2 disposed between the second variable impedance element 109 and the regulator circuit 112 and the voltage source 105, a first input terminal 101 connected to a third node A3 between the base side of the first bipolar transistor 106 and the first variable impedance element 108, a second input terminal 102 connected to a fourth node A4 between the base side of the second bipolar transistor 107 and the second variable impedance element 109, a first output terminal 103 connected to a collector of the first bipolar transistor 106, and a second output terminal 104 connected to a collector of the second bipolar transistor 107.

In the basic configuration of the balanced power amplifier, the first bipolar transistor 106 itself constitutes a first power amplifier element, and the second bipolar transistor 107 itself constitutes a second power amplifier element.

The first and second bipolar transistors 106, 107 respectively amplify high-frequency electric signals given from the first and second input terminals 101, 102, and output the amplified signals to the first and second output terminals 103, 104.

In the balanced power amplifier, by applying a voltage to the voltage source 105, voltages other than the voltage applied to between the opposite ends of the first resistance 110 and the voltage applied to between the opposite ends of the first variable impedance element 108 are applied as direct-current bias voltages to the base of the first bipolar transistor 106, while voltages other than the voltage applied to between the opposite ends of the second resistance 111 and the voltage applied to between the opposite ends of the second variable impedance element 109 are applied as direct-current bias voltages to the base of the second bipolar transistor 107.

In the balanced power amplifier, the size of a circuit element is regulated such that the circuit element is vertically symmetric with respect to a center line of the regulator circuit 112 running through the voltage source 105 shown by reference numeral S1 in FIG. 1, and the two first and second input terminals 101, 102 are given signals whose amplitude is almost identical and whose phase is displaced by approx. 180 degrees from each other. In the case of the high-frequency circuit, a potential in a location on S1 line in the drawing is constantly cancelled out to be zero potential, creating the state so-called a virtual ground.

Figure 2:
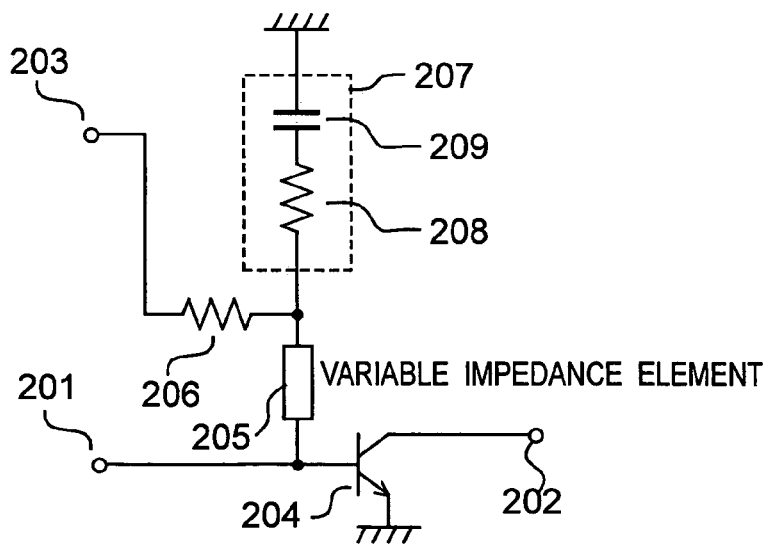
FIG. 2 is a view showing a high-frequency equivalent circuit which is equivalent to the lower half of the vertically symmetric balanced power amplifier shown in FIG. 1.

FIG. 2 is a view showing a high-frequency equivalent circuit which is equivalent to the lower half of the vertically symmetric balanced power amplifier shown in FIG. 1.

An input terminal 201 shown in FIG. 2 corresponds to reference numeral 101 in FIG. 1, an output terminal 202 correspond to reference numeral 103, a voltage source 203 corresponds to reference numeral 105, a bipolar transistor 204 corresponds to reference numeral 106, a variable impedance element 205 corresponds to reference numeral 108, a resistance 206 corresponds to reference numeral 110, and a regulator circuit 207 corresponds to the lower half from S1 of reference numeral 112.

A current flowing to the regulator circuit 207 shown in FIG. 2 is identical to the current flowing to the regulator circuit 112 shown in FIG. 1, whereas a high-frequency voltage applied to the opposite ends of the regulator circuit 207 shown in FIG. 2 is ½ of the high-frequency voltage applied to the opposite ends of the regulator circuit 112 shown in FIG. 1. Consequently, an impedance value of the regulator circuit 207 is ½ of that of the regulator circuit 112.

Figure 12:
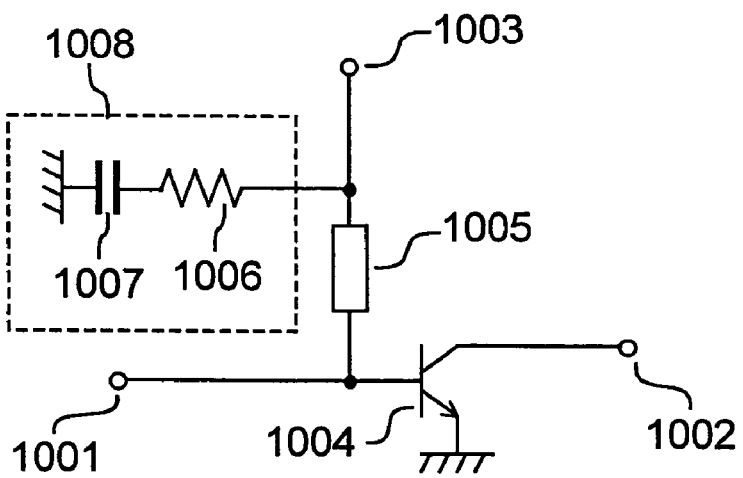
FIG. 12 is a conventional power amplifier with a distortion compensation circuit.

In the circuit shown in FIG. 2, if the regulator circuit 207 is composed of a serial circuit of a resistance 208 and a capacitance component 209 as shown in FIG. 2, then the circuit is equivalent to the conventional circuit shown in FIG. 12 except that the resistance 206 is inserted. Therefore, using the balanced power amplifier of the present invention shown in FIG. 1 makes it possible to perform distortion compensation equal to that of a single-end power amplifier in the prior art.

The resistance 206, which is a different portion between the circuit shown in FIG. 2 that is the lower half of FIG. 1 and the circuit in the prior art shown in FIG. 12, is essential to the function of the regulator circuit 207. Since S1 line shown in FIG. 1 is a virtual ground peculiar to a high-frequency circuit, reference numeral A3 shown in FIG. 1 also shows a high-frequency ground. However, if the first resistance 110 and the second resistance 111 are not present, points shown by reference numeral A1 and A2 in the drawing also become high-frequency grounds, which disturbs application of a voltage to the opposite ends of the regulator circuit 112. In the balanced power amplifier in the present invention, the first resistance 110 and the second resistance 111 are disposed so as not to cause the problem.

It is to be noted that although in the basic configuration of the balanced power amplifier in the present invention shown in FIG. 1, the first bipolar transistor 106 itself constitutes a first power amplifier element while the second bipolar transistor 107 itself constitutes a second power amplifier element, the first and second power amplifier elements may be respectively composed of multistage bipolar transistors, or may be further composed of a resistance and the like being combined. The first and second power amplifier elements may be any elements as long as they include a grounded-emitter bipolar transistor and they drive in parallel and in opposite phase.

Figure 3:
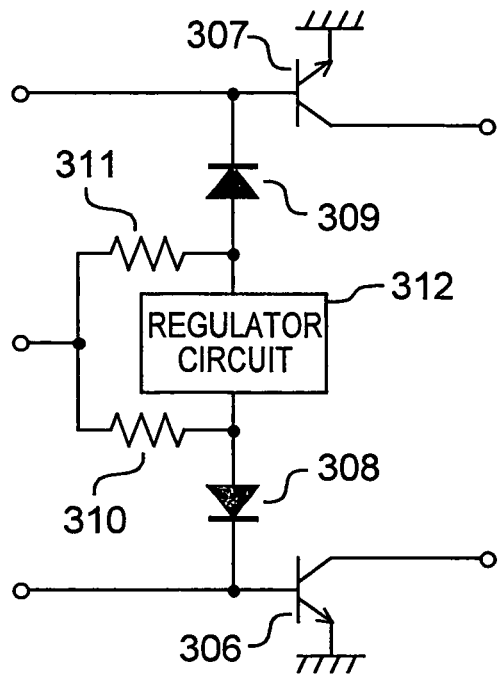
FIG. 3 is a first example showing the specific configuration of first and second variable impedance elements.

FIG. 3 is a view showing the specific configuration of the first and second variable impedance elements depicted as reference numeral 108, 109 in FIG. 1.

In the first example, the first and second variable impedance elements 108, 109 shown in FIG. 1 are respectively composed of a first diode element 308 and a second diode element 309 each having respective anodes connected to a first resistance 310 and a second resistance 311 on the side of a regulator circuit 312 (first and second nodes), and respective cathodes connected to each base side of a first bipolar transistor 306 and a second bipolar transistor 307 (third and fourth nodes).

If the first and second variable impedance elements are composed of the first and second diode elements 308, 309 as with the aforementioned first example, then the voltage dependence of the opposite ends of the respective first and second diode elements 308, 309 may be identical to the voltage dependence of the opposite sides of each impedance in a diode portion between the base and the emitter in the first and second bipolar transistors 307, 307. Further, regardless of the size of inputted voltages, phase distortion may be compensated while amplitude distortion of outputted voltages is compensated to prevent a gain from decreasing.

Figure 4:
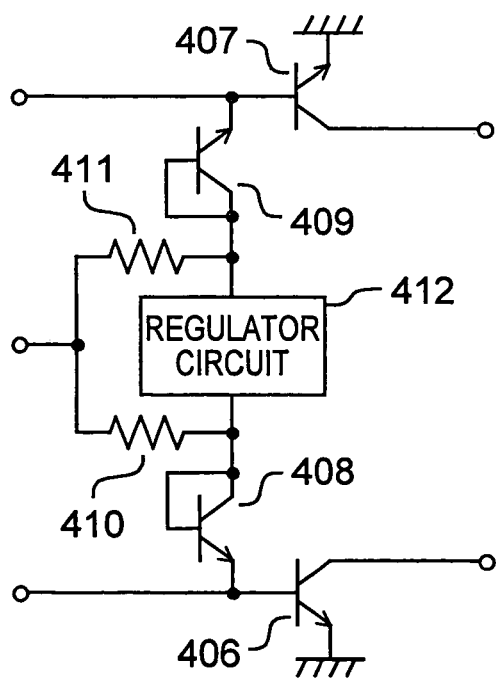
FIG. 4 is a second example showing the specific configuration of first and second variable impedance elements.

FIG. 4 is a second example showing the specific configuration of the first and second variable impedance elements referred to as reference numeral 108, 109 in FIG. 1.

In the second example, the first and second variable impedance elements 108, 109 shown in FIG. 1 are respectively composed of a third bipolar transistor 408 and a fourth bipolar transistor 409 with each collector and base being connected to each end of a first resistance 410 and a second resistance 411 on the side of a regulator circuit 412 (first and second nodes), and with each emitter being connected to each base of a first bipolar transistor 406 and a second bipolar transistor 407 (third and fourth nodes).

If the first and second variable impedance elements are composed of the third and fourth bipolar transistors 408, 409 with each collector and base being connected to the first and second resistances 410, 411 and with each emitter being connected to the first and second bipolar transistors 406, 407 as with the aforementioned second example, then respective emitter currents of the third and fourth bipolar transistors 408, 409 may be set to be the sum of respective base currents and respective collector currents, and may also be proportional to the respective base currents. Therefore, the respective emitter currents of the third and fourth bipolar transistors 408, 409 obtain current-voltage characteristics like diodes with respect to the inputted voltages, so that regardless of the size of the inputted voltages, phase distortion may be compensated while amplitude distortion of outputted voltages is compensated to prevent a gain from decreasing.

Figure 5:
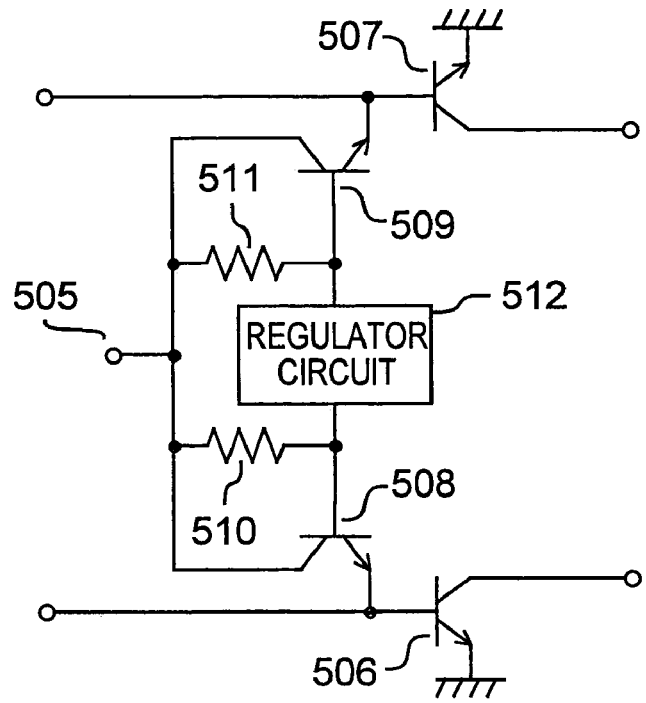
FIG. 5 is a third example showing the specific configuration of first and second variable impedance elements.

FIG. 5 is a third example showing the specific configuration of the first and second variable impedance elements depicted by reference numeral 108, 109 in FIG. 1.

In the third example, the first and second variable impedance elements 108, 109 shown in FIG. 1 are respectively composed of a third bipolar transistor 508 and a fourth bipolar transistor 509 with each base being connected to each end of a first resistance 510 and a second resistance 511 on the side of a regulator circuit 512 (first and second nodes), each emitter being connected to each base of a first bipolar transistor 506 and a second bipolar transistor 507 (third and fourth nodes), and with each collector being connected to each end of the first resistance 510 and the second resistance 511 on the side of a voltage source 505.

If the first and second variable impedance elements are composed of the third and fourth bipolar transistors 508, 509 with each base being connected to each end of the first resistance 510 and the second resistance 511 on the side of the regulator circuit 512, each emitter being connected to each base of the first bipolar transistor 506 and the second bipolar transistor 507, and with each collector being connected to each end of the first resistance 510 and the second resistance 511 on the side of the voltage source 505 as with the aforementioned third example, then it becomes possible to provide the first and second resistances 510, 511 with a function to regulate each collector current and emitter current of the third and fourth bipolar transistors 508, 509 in addition to the original function to generate potential difference between the opposite ends of the regulator circuit 512. Further, even after the third and fourth bipolar transistors 508, 509 to be used are selected, regulating the values of the first and second resistances 510, 511 makes it possible to increase regulation freedom in the distortion compensation and to provide the power amplifier with a high-efficiency power amplification factor.

Figure 6:
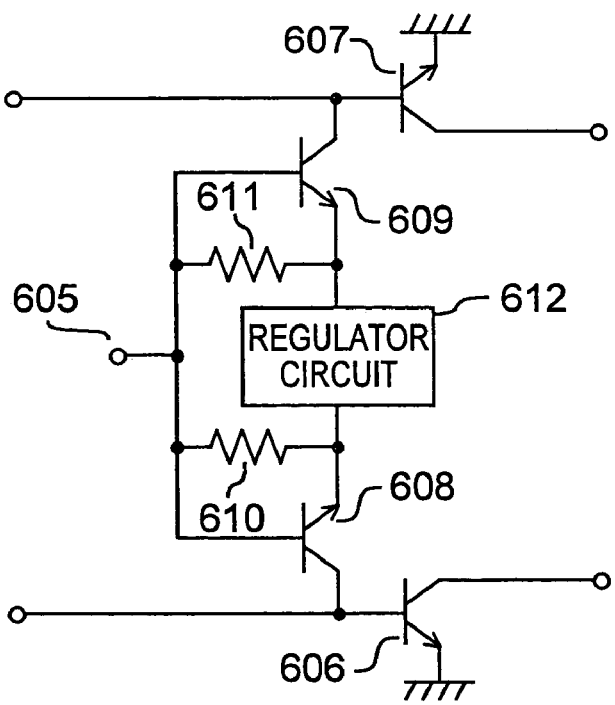
FIG. 6 is a fourth example showing the specific configuration of first and second variable impedance elements.

FIG. 6 is a fourth example showing the specific configuration of the first and second variable impedance elements denoted by reference numeral 108, 109 in FIG. 1.

In the fourth example, the first and second variable impedance elements 108, 109 shown in FIG. 1 are respectively composed of a third bipolar transistor 608 and a fourth bipolar transistor 609 with each emitter being connected to a first resistance 610 and a second resistance 611 each on the side of a regulator circuit 612 (first and second nodes), each collector being connected to the based of a first bipolar transistor 606 and a second bipolar transistor 607 (third and fourth nodes), and with each base being connected to the first resistance 610 and the second resistance 611 each on the side of a voltage source 605.

The transistor performs transistor operation even if the connecting relation of the emitter and the collector is reversed, the collector current is almost proportional to the base current, and the collector current has current-voltage characteristics like diodes with respect to the inputted voltages. In the fourth example, in comparison with the first and second bipolar transistors 508, 509 in the third example shown in FIG. 5, the first and the second variable impedance elements are composed, with use of the characteristics of the transistor, of the third and fourth bipolar transistors 608, 609 whose connecting relation regarding the emitter and collector is opposite to each other. Therefore, if the first and second impedances are composed of the third and fourth bipolar transistors 608, 609 as with the fourth example, then like the third example, even after the third and fourth bipolar transistors 608, 609 to be used are selected, regulating the values of the first and second resistances 610, 611 makes it possible to increase regulation freedom in the distortion compensation and to provide the power amplifier with a high-efficiency power amplification factor.

If the first variable impedance element is composed of an element including a third bipolar transistor which is structured so as to form PN junction between the first resistance component and a base of the first bipolar transistor, while the second variable impedance element is composed of an element including a fourth bipolar transistor which is structured so as to form PN junction between the second resistance component and a base of the second bipolar transistor as with the second to fourth examples, then regardless of the size of inputted voltages, phase distortion may be compensated while amplitude distortion of outputted voltages is compensated to prevent a gain from decreasing.

Figure 7:
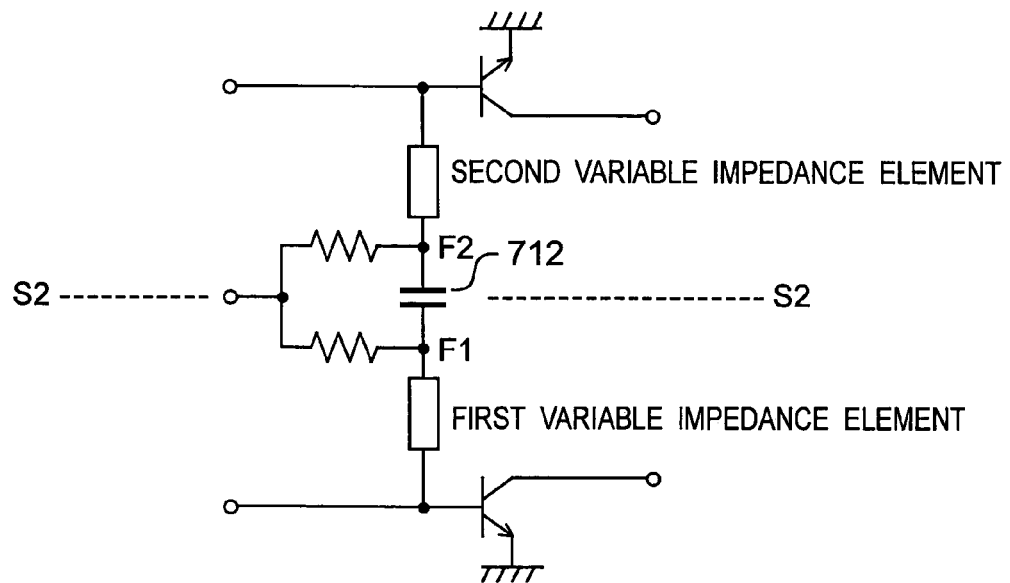
FIG. 7 is a first example showing the specific configuration of regulator circuit.

FIG. 7 is a first example showing the specific configuration of the regulator circuit denoted by reference numeral 112 in FIG. 1.

In the first example, the regulator circuit 112 shown in FIG. 1 is composed of one capacitance component 712.

In this first example, since the regulator circuit 112 shown in FIG. 1 is composed of one capacitance component 712, a plane S2 in the drawing running through the center between two electrodes of the capacitance component 712 and being in parallel with the electrodes functions as a virtual ground for the odd mode (reversed-phase component), so that the lower half (or upper half) circuit of the balanced power amplifier becomes a circuit equivalent to the circuit with the resistance 208 being 0 in FIG. 2. Therefore, constituting the regulator circuit from the capacitance component 712 allows the distortion compensation for the odd mode (reversed-phase component).

For the even mode (common-phase component), the opposite-end points of the capacitance component 712 referred to as reference numeral F1 and F2 in FIG. 7 are driven in common mode, by which the potential difference between the opposite ends of the capacitance component 712 is vanished, making it difficult for the regulator circuit 712 to function. This suppresses the function of the distortion compensation circuit.

According to the first example, the regulation circuit denoted by reference numeral 112 in FIG. 1 is composed of a single capacitance component 712, which achieves considerable reduction in the number of component parts of the regulator circuit. Further, it becomes possible to perform the distortion compensation function for an original odd mode (reversed-phase component), whereas not to perform the distortion compensation function for an even mode (common-phase component) that is a parasitic component.

Figure 8:
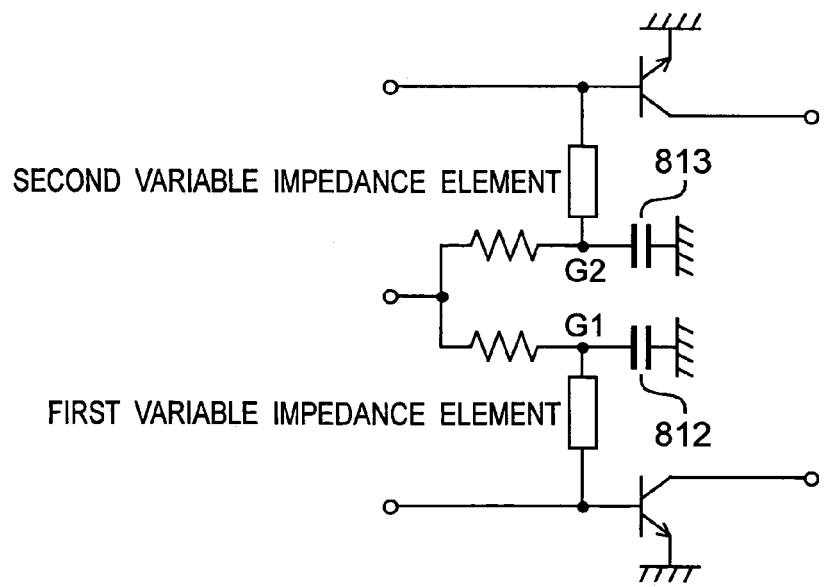
FIG. 8 is a second example showing the specific configuration of regulator circuit.

FIG. 8 is a second example showing the specific configuration of the regulation circuit denoted by reference numeral 112 in FIG. 1.

In this second example, two terminals G1, G2 of the regulator circuit are open (in open state), and capacitor components 812, 813 are respectively connected to between these two terminals G1, G2 and grounds.

In this second example, for both the odd mode (reversed-phase component) and the even mode (common-phase component) that is a parasitic component, the lower half (or upper half) circuit of the balanced power amplifier becomes a circuit equivalent to the circuit with the resistance 208 being 0 in FIG. 2. This makes it possible to perform the distortion compensation function without discrimination between the odd mode and the even mode.

Figure 9:
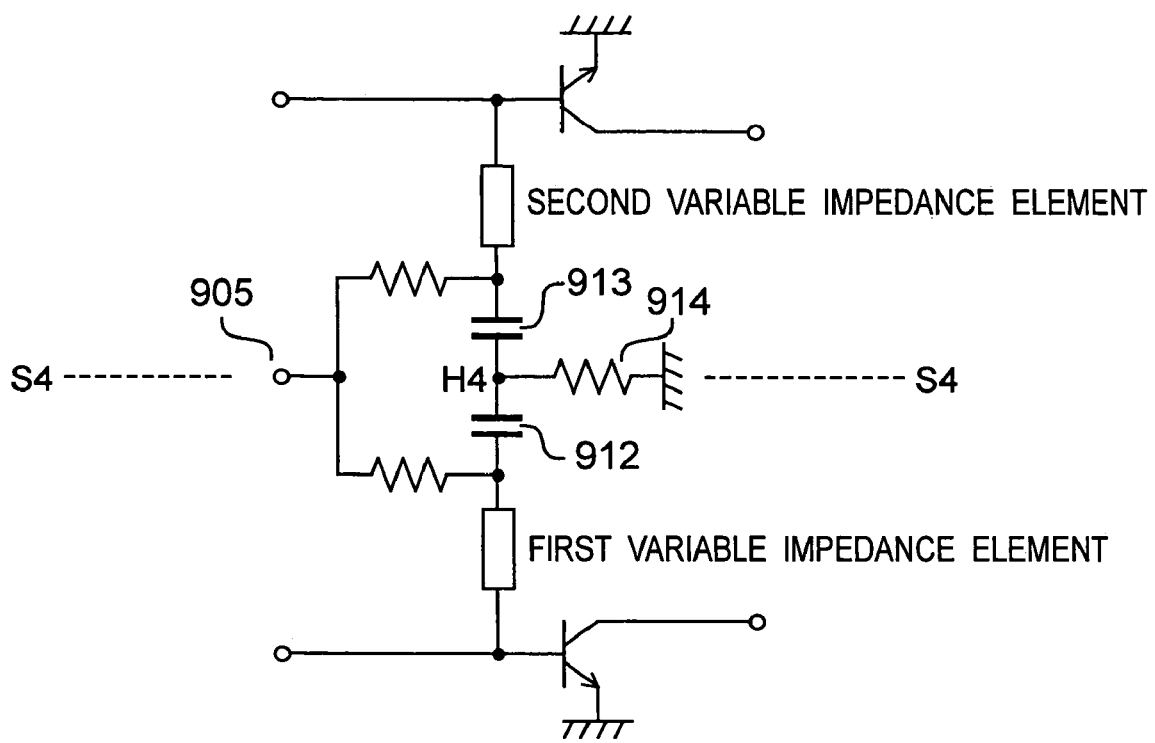
FIG. 9 is a third example showing the specific configuration of regulator circuit.

FIG. 9 is a third example showing the specific configuration of the regulation circuit denoted by reference numeral 112 in FIG. 1.

In this third example, the regulator circuit is constituted from a T-shaped circuit composed of two capacitance components 912 and 913 disposed in series and one resistance 914 inserted in between these two capacitance components and a ground.

In this third example, for the odd mode (reversed-phase component), a portion on the line connecting a voltage source 905 denoted by reference numeral S4 in FIG. 9 and a point H4 between the capacitance component 912 and the capacitance component 913 serves as a virtual ground, whereas the lower half (or upper half) circuit of the balanced power amplifier becomes a circuit equivalent to the circuit with the resistance 208 being 0 in FIG. 2. This makes it possible to perform the distortion compensation function over the odd mode. It is to be noted that for the odd mode (reversed-phase component), the point shown by reference numeral H4 serves as a virtual ground, and so the resistance 914 fails to function.

For the parasitic even mode (common-phase component), the point H4 is not a virtual ground but has a potential so that the resistance 914 functions. Therefore, setting the value of the resistance 914 at a value which tends to absorb and attenuate high-frequency signals (e.g., approx. 1 to 50Ω) allows the resistance 914 to function as an attenuator, thereby allowing attenuation for the even mode (common-phase component).

Figure 10:
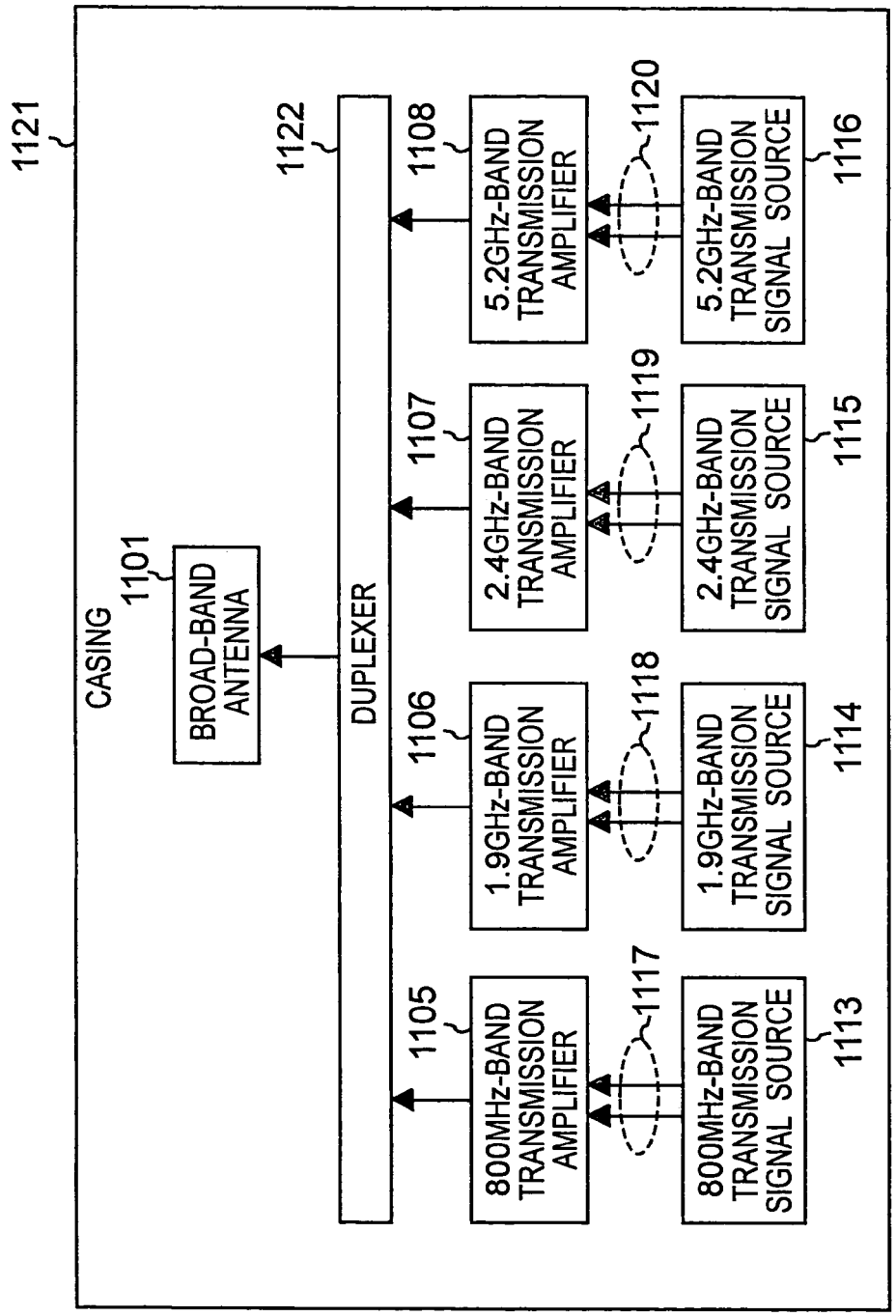
FIG. 10 is a schematic block diagram showing a transmission system of a high-frequency communication apparatus in one embodiment of the present invention.

FIG. 10 is a schematic block diagram showing a transmission system of a high-frequency communication apparatus in one embodiment of the present invention.

As shown in FIG. 10, inside a casing 1121, a 800 MHz-band signal produced by a signal source 1113 is amplified by an amplifier 1105 and then radiated from a broad-band antenna 1101 through a duplexer 1122, while a 1.9 GHz-band signal produced by a signal source 1114 is amplified by an amplifier 1106 and then radiated from the broad-band antenna 1101 through the duplexer 1122. Further, a 2.4 GHz-band signal produced by a signal source 1115 is amplified by an amplifier 1107 and then radiated from the broad-band antenna 1101 through the duplexer 1122, while a 5.2 GHz-band signal produced by a signal source 1116 is amplified by an amplifier 1108 and then radiated from the broad-band antenna 1101 through the duplexer 1122. As the broad-band antenna 1101, an already commercialized antenna for UWB (Ultra Wide Band) system with a specific bandwidth of approx. 100% is used. The duplexer 1122 is manufactured with use of a switch circuit. With use of the fact that four frequency bands (800 MHz, 1.9 GHz, 2.4 GHz, and 5.2 GHz) are distant from each other, the duplexer 1122 may be manufactured by general duplexer technique (lossless power combiner with a filter circuit being combined). The duplexer 1122 and the broad-band antenna 1101 constitute an antenna section.

Figure 11:
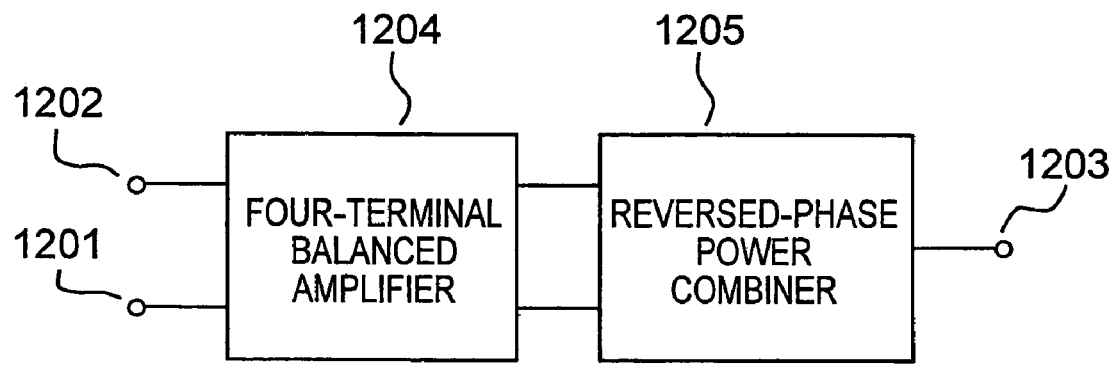
FIG. 11 is a balanced power amplifier in the present invention.
Figure 13:
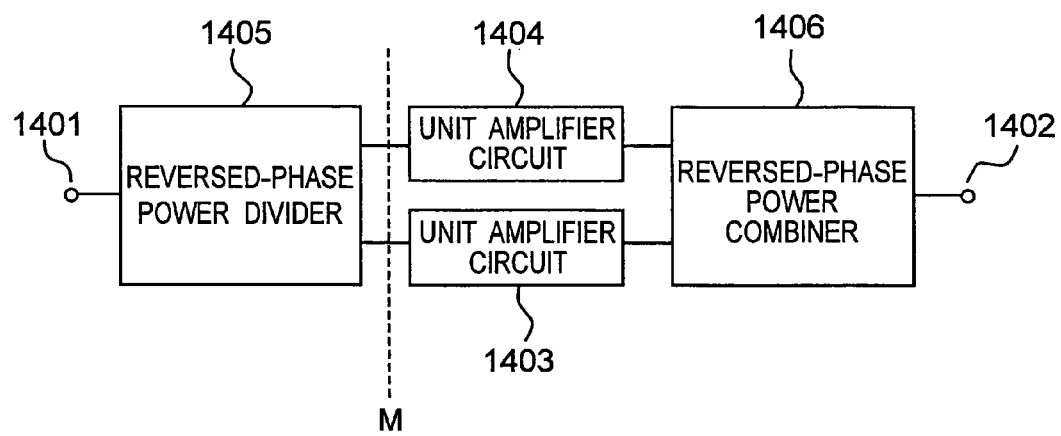
FIG. 13 is a conventional balanced power amplifier.

The high-frequency communication apparatus use a balanced power amplifier shown in FIG. 11 as transmission amplifiers 1105 to 1108. Unlike the conventional balanced power amplifier shown in FIG. 13, the balanced power amplifier shown in FIG. 11, which does not include a reversed-phase divider (denoted by reference numeral 1405 in FIG. 13) disposed on the input side, constitutes a three-terminal circuit. Then, differential (balanced) signals inputted from two input terminals 1201, 1202 are amplified by four-terminal amplifier 1204, and then combined efficiently by a reversed-phase power combiner 1205 before being outputted from one output terminal 1203. As the four-terminal amplifier 1204, the balanced power amplifier of the present invention is used.

Figure 14:
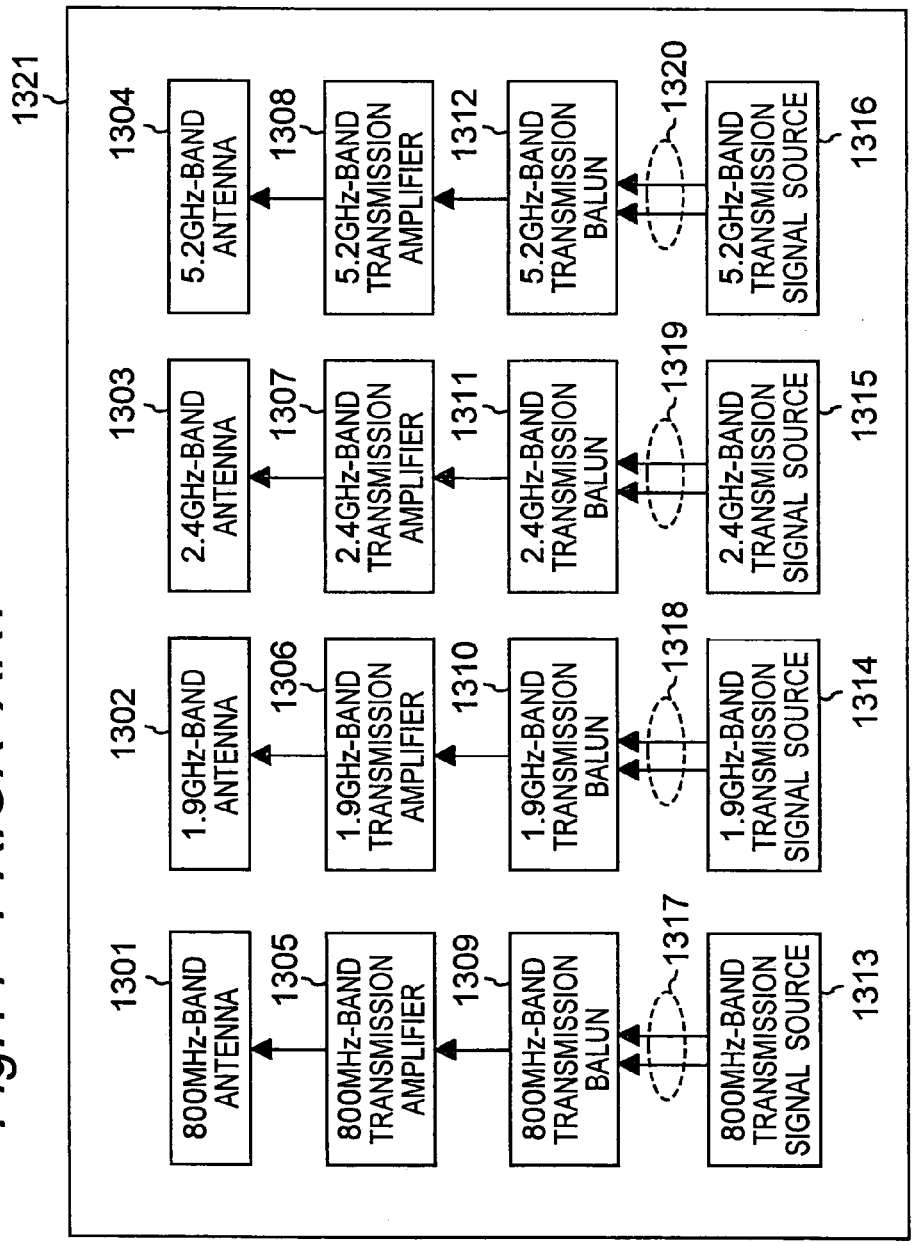
FIG. 14 is a schematic block diagram showing a transmission system of a conventional high-frequency communication apparatus.

Using a circuit having the balanced power amplifier of the present invention as the transmission amplifiers 1105 to 1108 shown in FIG. 10 makes it possible to directly connect the transmission amplifiers 1105 to 1108 and differential lines 1117 to 1120. Consequently, it becomes possible to eliminate the baluns 1317 to 1320 shown in FIG. 14, which were conventionally required, and therefore the number of component parts can be considerably reduced, allowing considerable reduction in size, weight and cost of high-frequency communication apparatuses.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A balanced power amplifier comprising:
   a voltage source;
   a first power amplifier element including at least a grounded-emitter first bipolar transistor;
   a second power amplifier element including at least a grounded-emitter second bipolar transistor;
   a first variable impedance element, one end of which is electrically connected to a base side of the first bipolar transistor;
   a second variable impedance element, one end of which is electrically connected to a base side of the second bipolar transistor;
   a two-terminal regulator circuit connected to between the first variable impedance element and the second variable impedance element;
   a first resistance connected to between a first node disposed between the first variable impedance element and the regulator circuit and the voltage source;
   a second resistance connected to between a second node disposed between the second variable impedance element and the regulator circuit and the voltage source;
   a first input terminal connected to a third node disposed between a base side of the first bipolar transistor in the first power amplifier element and the first variable impedance element; and
   a second input terminal connected to a fourth node disposed between a base side of the second bipolar transistor in the second power amplifier element and the second variable impedance element, wherein
   the first and second power amplifier elements are driven in parallel and in opposite phase.

2. The balanced power amplifier as defined in claim 1, wherein
   the regulator circuit is a single capacitance component whose opposite ends are connected to the first node and the second node.

3. The balanced power amplifier as defined in claim 1, wherein
   the regulator circuit is composed of a first capacitance component connected to between the first node and a ground, and a second capacitance component connected between the second node and a ground.

4. The balanced power amplifier as defined in claim 1, wherein
   the regulator circuit is a T-shaped circuit composed of two capacitance components disposed in series between the first node and the second node, and a resistance connected to between a node disposed between these two capacitance components and a ground.

5. The balanced power amplifier as defined in claim 1, wherein
   the first variable impedance element is composed of a first diode element having an anode connected to the first node and a cathode connected to the third node, while the second variable impedance element is composed of a second diode element having an anode connected to the second node and a cathode connected to the fourth node.

6. The balanced power amplifier as defined in claim 1, wherein
   the first variable impedance element includes a third bipolar transistor which is structured so as to form PN junction between the first resistance component and a base of the first bipolar transistor, while the second variable impedance element includes a fourth bipolar transistor which is structured so as to form PN junction between the second resistance component and a base of the second bipolar transistor.

7. The balanced power amplifier as defined in claim 1, wherein
the first variable impedance element is composed of a third bipolar transistor having a collector and a base connected to the first node and an emitter connected to the third node, while the second variable impedance element is composed of a fourth bipolar transistor having a collector and a base connected to the second node and an emitter connected to the fourth node.

8. The balanced power amplifier as defined in claim 1, wherein
the first variable impedance element is composed of a third bipolar transistor having an emitter connected to the first node, a base connected to a node disposed between the first resistance and the voltage source side, and a collector connected to the third node, while the second variable impedance element is composed of a fourth bipolar transistor having an emitter connected to the second node, a base connected to a node disposed between the second resistance and the voltage source side, and a collector connected to the fourth node.

9. The balanced power amplifier as defined in claim 1, wherein
the first variable impedance element is composed of a third bipolar transistor having a base connected to the first node, a collector connected to a node disposed between the first resistance and the voltage source side, and an emitter connected to the third node, while the second variable impedance element is composed of a fourth bipolar transistor having a base connected to the second node, a collector connected to a node disposed between the second resistance and the voltage source side, and an emitter connected to the fourth node.

10. The balanced power amplifier as defined in claim 1, wherein
the first and second bipolar transistors and the first and second variable impedance elements are integrally formed on one semiconductor substrate.

11. A high-frequency communication apparatus comprising:
a high-frequency integrated circuit serving as a transmission signal source;
the balanced power amplifier as defined in claim 1 for receiving differential output signals outputted from the high-frequency integrated circuit and amplifying the differential output signals;
a reversed-phase power combiner for performing reversed-phase power combination of the signals from the balanced power amplifier; and
an antenna section for radiating the signals from the reversed-phase power combiner outward.

* * * * *